(12) United States Patent
Zeika et al.

(10) Patent No.: US 8,431,046 B2
(45) Date of Patent: Apr. 30, 2013

(54) USE OF HETEROCYCLIC RADICALS FOR DOPING ORGANIC SEMICONDUCTORS

(75) Inventors: Olaf Zeika, Dresden (DE); Andrea Lux, Dresden (DE); Andre Gruessing, Mannheim (DE); Michael Limmert, Dresden (DE); Horst Hartmann, Dresden (DE); Ansgar Werner, Dresden (DE)

(73) Assignee: Novaled AG, Dresden (DE)

( * ) Notice: Subject to any disclaimer, the term of this patent is extended or adjusted under 35 U.S.C. 154(b) by 1057 days.

(21) Appl. No.: 12/293,757

(22) PCT Filed: Mar. 16, 2007

(86) PCT No.: PCT/EP2007/002359
§ 371 (c)(1),
(2), (4) Date: Jan. 27, 2009

(87) PCT Pub. No.: WO2007/107306
PCT Pub. Date: Sep. 27, 2007

(65) Prior Publication Data
US 2011/0108772 A1    May 12, 2011

(30) Foreign Application Priority Data
Mar. 22, 2006 (EP) .................................. 06005834

(51) Int. Cl.
*H01B 1/00* (2006.01)
*C08G 73/06* (2006.01)
*H01L 29/08* (2006.01)

(52) U.S. Cl.
USPC .............................. 252/500; 528/423; 257/40

(58) Field of Classification Search .................... 257/40; 252/500–521.6; 528/423
See application file for complete search history.

(56) References Cited

U.S. PATENT DOCUMENTS

| | | | |
|---|---|---|---|
| 2,566,208 A | 8/1951 | Jenkins | |
| 3,083,242 A | 3/1963 | Ramsden | |
| 3,226,450 A | 12/1965 | Blazejak et al. | |
| 3,558,671 A | 1/1971 | Martin | |
| 3,563,751 A | 2/1971 | Cohen | |

(Continued)

FOREIGN PATENT DOCUMENTS

| | | |
|---|---|---|
| CA | 2549309 | 9/2005 |
| CH | 354065 | 5/1961 |
| CH | 354066 | 5/1961 |
| DE | 19836408 | 2/2000 |
| DE | 10261662 | 7/2004 |

(Continued)

OTHER PUBLICATIONS

Pragat et al., "Electrochemical chemiluminescence in mechanistic investigations of electroorganic reactions. Part VI. Sensitive detection of cation radicals by bis(1,2,3-trimethyl-2,3-dihydrobenzimidazolyl-(2))/luminophor systems", J. of Electroanalytic Chemistry and Interfacial Electrochemistry, 192, pp. 245-264 (1986).*

(Continued)

*Primary Examiner* — Mark Kopec
*Assistant Examiner* — Jaison Thomas
(74) *Attorney, Agent, or Firm* — Sutherland Asbill & Brennan LLP

(57) ABSTRACT

The present invention relates to the use of heterocyclic radicals or diradicals, their dimers, oligomers, polymers, dispiro compounds and polycycles for use as dopant for doping an organic semiconductive matrix material, where the dopants have a structure based on the following formulae.

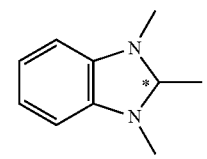

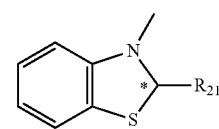

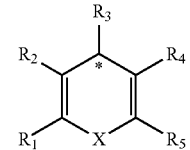

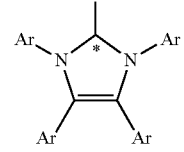

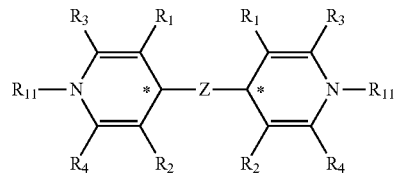

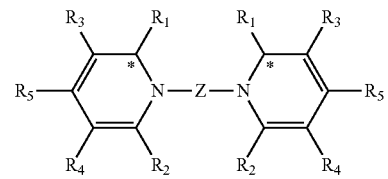

6 Claims, No Drawings

U.S. PATENT DOCUMENTS

| | | | |
|---|---|---|---|
| 4,003,943 | A | 1/1977 | Fukunaga |
| 4,066,569 | A | 1/1978 | Lim |
| 4,133,821 | A | 1/1979 | West et al. |
| 4,618,453 | A | 10/1986 | Kim |
| 4,960,916 | A | 10/1990 | Pazik et al. |
| 5,093,698 | A | 3/1992 | Egusa |
| 5,110,835 | A | 5/1992 | Walter et al. |
| 5,247,226 | A | 9/1993 | Sato et al. |
| 5,281,730 | A | 1/1994 | Zambounis et al. |
| 5,292,881 | A | 3/1994 | Berneth et al. |
| 5,393,614 | A | 2/1995 | Nakada |
| 5,556,524 | A | 9/1996 | Albers |
| 5,811,833 | A | 9/1998 | Thompson |
| 5,840,217 | A | 11/1998 | Lupo et al. |
| 5,922,396 | A | 7/1999 | Thompson et al. |
| 6,013,384 | A | 1/2000 | Kido et al. |
| 6,013,982 | A | 1/2000 | Thompson et al. |
| 6,103,459 | A | 8/2000 | Diel et al. |
| 6,207,835 | B1 | 3/2001 | Reiffenrath et al. |
| 6,350,534 | B1 | 2/2002 | Boerner et al. |
| 6,423,429 | B2 | 7/2002 | Kido et al. |
| 6,524,728 | B1 | 2/2003 | Kijima et al. |
| 6,700,058 | B2 | 3/2004 | Nelles et al. |
| 6,747,287 | B1 | 6/2004 | Toguchi et al. |
| 6,824,890 | B2 | 11/2004 | Bazan et al. |
| 6,908,783 | B1 | 6/2005 | Kuehl et al. |
| 6,972,334 | B1 | 12/2005 | Shibanuma et al. |
| 7,081,550 | B2 | 7/2006 | Hosokawa et al. |
| 7,345,300 | B2 | 3/2008 | Qin |
| 2003/0064248 | A1 | 4/2003 | Wolk |
| 2003/0165715 | A1 | 9/2003 | Yoon et al. |
| 2003/0234397 | A1 | 12/2003 | Schmid et al. |
| 2004/0068115 | A1 | 4/2004 | Lecloux et al. |
| 2004/0076853 | A1 | 4/2004 | Jarikov et al. |
| 2005/0023974 | A1 | 2/2005 | Chwang et al. |
| 2005/0040390 | A1 | 2/2005 | Pfeiffer et al. |
| 2005/0061232 | A1 | 3/2005 | Werner et al. |
| 2005/0072971 | A1 | 4/2005 | Marrocco et al. |
| 2005/0086251 | A1 | 4/2005 | Hatscher et al. |
| 2005/0110009 | A1 | 5/2005 | Blochwitz-Nimoth et al. |
| 2005/0121667 | A1 | 6/2005 | Kuehl et al. |
| 2006/0022193 | A1* | 2/2006 | Williamson et al. ............ 257/40 |
| 2006/0049397 | A1 | 3/2006 | Pfeiffer et al. |
| 2007/0026257 | A1 | 2/2007 | Begley et al. |
| 2007/0058426 | A1 | 3/2007 | Sokolik et al. |
| 2007/0090371 | A1 | 4/2007 | Drechsel et al. |
| 2007/0116984 | A1 | 5/2007 | Park et al. |
| 2007/0145355 | A1 | 6/2007 | Werner et al. |
| 2007/0249148 | A1 | 10/2007 | Werner et al. |
| 2007/0252140 | A1 | 11/2007 | Limmert et al. |
| 2008/0103315 | A1 | 5/2008 | Egawa et al. |
| 2008/0122345 | A1 | 5/2008 | Sakata et al. |
| 2008/0145708 | A1 | 6/2008 | Heil et al. |
| 2008/0265216 | A1 | 10/2008 | Hartmann et al. |
| 2009/0001327 | A1 | 1/2009 | Werner et al. |

FOREIGN PATENT DOCUMENTS

| | | |
|---|---|---|
| EP | 1000998 | 5/2000 |
| JP | 61254582 | 11/1986 |
| JP | 63172274 | 7/1988 |
| JP | 63172275 | 7/1988 |
| JP | 04338760 | 11/1992 |
| JP | 7168377 | 7/1995 |
| JP | 7-196780 A | 8/1995 |
| JP | 2001-319698 A | 11/2001 |
| JP | 2004010703 | 1/2004 |
| JP | 2004335557 | 11/2004 |
| JP | 2005167175 | 6/2005 |
| JP | 2005/525696 | 8/2005 |
| WO | WO 03/088271 | 10/2003 |
| WO | WO 03/104237 | 12/2003 |
| WO | WO 2006/067800 | 6/2006 |
| WO | WO 2008/022633 | 2/2008 |

OTHER PUBLICATIONS

Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).

Akutagawa, T. et al. "Multi Electron and Proton-Transfer System Based on 2,2'-biimidazole derivatives," Science and Technology of Syn. Metals, 1994, 346.

Alonso, R. A. et al. "Photostimulated Reaction of Diphenylarsenide and Diphenylstibide Ions with Haloaromatic Compounds by the Srn1 Mechanism. Electron Transfer vs. Bond Breaking of the Radical Anion Intermediate," J. Org. Chem. (1982) 47(1) pp. 77-80.

Auch et al. "Eine neue Synthese und die Kristallstrukturanalyse von., Krokonat-Blau . . . ," Chem. Ber. 120, 1691-1696 (1987), extract, pp. 1691-1693, 6 total pages.

Bach, U. et al. "Solid-state dye-sensitized mesoporous $TiO_2$ solar cells with high photon-to-electron conversion efficiencies," Nature, vol. 395, Oct. 8, 1998, pp. 583-585.

Bamgboye, T.T. et a. "Lewis acidity of Ph2SbX3, wherein X = Cl or Br. Crystal structures of Ph2SbCl3*H20 and Ph2SbBr3*MeCN," J. of Organometallic Chem. vol. 362, Feb. 28, 1989, pp. 77-85.

Bard, A. J., Faulkner, R.J., Electrochemical Methods: Fundamentals and Applications, Wiley, 2nd Ed., 2000 (Chapter 6).

Barton, D.H.R. et al. "Comparative Arylation Reactions with Pentaphenylbismuth and with Triphenylbismuth Carbonate," J. Chem. Soc. Chem. Commun. (1980) 17, pp. 827-829.

Baumgartel, H. et al., "Polarographische Untersuchungen zur Konformation von 1.2.3.4.5-pentaarylimidazoliumkationen," Ber. Bunsenges (1972) 76/2, 94-100.

Baumgartel, H. et al.,"Uber eine neue Synthese von tetraaryl-imidazolen und pentaaryl-imidazolium-salzen," Chem. Ber. (1968), 101, 3504.

Bhattacharya, S.N. et al. "Preparation & Characterization of Some Triarylarsenic & Triarylantimony Mixed Halides & Related Compounds," Indian J. Chem. 16A (1978) pp. 778-781.

Blinka et al. "Octacyanotetramethylenecyclobutane Dianioin and its Anion-Radical," Tetrahedron Lett. (1983). vol. 24, No. 1567-1568.

Blochwitz, J., et al., "Low voltage organic light emitting diodes featuring doped phthalocyanine as hole transport material," Applied Physics Letters, vol. 73, No. 6, Aug. 10, 1998, pp. 729-731.

Bonati, F. et al. "Reactions of C-imidazolyllithium derivatives with Broup Ib compounds: tris[micro-(1-alkylimidazolato-N3, C2)]tri-gold (I) and -silver (I)," J. Organomet. Chem. 1989, 375, pp. 147-160.

Brucsis, L. et al. "Substituionasreaktionen an 1,4-dihalogen-2,3,5,6-tetracyan-benzolen," Chem. Ber. 109(1976) pp. 2469-2674.

Cherkashin M. I. et al. "Studies on 2,4,5-triarylimidazoles," Izv. Akad. Nauk SSSR, Seriya Khim. 1982, 2, pp. 376-377.

Chonan et al. "The synthesis of difluoro and dimethyl derivatives of 2,6-bis(dicyanomethylene)-2,6-dihydro-4H-cyclopenta[2,1-b:3,4-b']-dithiophen-4-one (CPDT-TCNQ) and the Conducting Properties of the Metallic Salts Based on the Dimethy Derivative," The Chemical Society of Japan (2004) pp. 1487-1497.

Curini, M. et al., "Ytterbium Triflate Promoted Synthesis of Benzimidazole Derivatives," Synlett, No. 10, pp. 1832-1834, 2004.

Dedik, S.G. et al. "Tetrahalotetraazafulvalenes-new strong electron acceptors," Chemistry of Heterocyclic Compounds (A Translation of Khimiyageterotsiklicheskikh Soedinenii), Plenum Press Co., New York, U.S., vol. 10, Jan. 1, 1989, p. 1421.

DeLuca, Mark et al., "The p-toluenesulfonic acid promoted synthesis of 2-substituted benzoxazoles and benzimidazoles from diacylated precursors," Tetrahedron, vol. 53, No. 2, pp. 457-464, 1997.

Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Fatiadi et al. "Electrochemical Oxidation of Several Oxocarbon Salts in N,N-dimethylformamide," J. Electroanalytical Chem. (1982) vol. 135, pp. 193-209.

Fatiadi, "Psuedooxocarbons, Synthesis of 1,2,3-tris(dicyanomethylene)croconate Salts; A New Bond-Delocalized Dianion, Croconate Blue," J. Org. Chem. 1980, 45, 1338-1339.

Fatiadi, "Synthesis of 1,3-(dicyanomethylene)croconate Salts. New Bond-Delocalized Dianion, Croconate Violet," Journal of the American Chemical Society, Apr. 12, 1978, pp. 2586-2587.

Fausett, B.W. et al. "Palladium-catalyzed coupling of thiol esters with aryl and primary and secondary alkyl organiindium reagents," J. Org. Chem. (2005) 70(12) pp. 4851-4853.

Fenghong Li et al., "Leuco Crystal Violet as a dopant for n-doping of organic thin films of fullerene C60," J. Phys. Chem. B 2004, 108, pp. 17076-17088.

Fild, Manfred et al. "Group VA pentafluorophenyl compounds. 14. Pentafluorophenyl-substituted phosphoranes," Zeitschrift Fuer Anorganische and Allgemeine Chemie, 439, pp. 145-152 (1978).

Fukunaga, T. et al. "Negatively substituted trimethylenecyclopropane dianions," J. Am. Chem. Soc., 1976, pp. 610-613.

Gan, F. "Optical nonlinearity of hybrid and nanocomposite materials prepared by the Sol-Gel method," J. of Sol-Gel Science and Technology, 13, 559-563 (1998).

Ganzorig, C. et al., "p-Typed Semiconducts of Aromatic Diamines Doped with SbCl5," Chemistry Letters 2000, pp. 1032-1033.

Gibbons, M.N. et al. "Multiply Bridged Diantimony Compounds," Phosphorus, Sulfur, & Silicon 93/94 (1994).

Giovanella, et al. "Electroluminescence from two fluorinated organic emitters embedded in polyvinyl carbazole," Applied Physics Letters, vol. 87, pp. 171910-1-171910-3.

Glemser, O. et al. "Synthese von Tris-pentafluorphenylarsin, -stibin und -phosphin sowie von Trimethyl-pentafluor-phenylsilan," Angew. Chemie (1964) 76, 953.

Gogoi, P. et al. "An efficient and one-pot synthesis of imidazolines and benzimidazoles via anaerobic oxidation of carbon-nitrogen bonds in water," Tetrahedron Lett. 2006, 47, pp. 79-82.

Gregg, B.A. et al., "On the superlinear increase in conductivity with dopant concentration in excitonic semiconductors," Applied Physics Letters, vol. 84, No. 10, Mar. 8, 2004, pp. 1707-1709.

Grimmett, M. R., "Imidazole and benzimidazole synthesis," Tables of Contents, pp. 1-10, Academic Press, Harcourt Brace & Company, Publishers, London, San Diego, NY, Boston et al., 1997.

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Haddon, R.C. et al., "Conducting films of C60 and C70 by alkali-metal doping," Nature, vol. 350, Mar. 28, 1991, pp. 320-322.

Harada, Kentaro et al., "Realization of organic pn-homojunction using a novel n-type doping technique, Proceedings of SPIE—The international Society for Optical Engineering; Organic Optoelectronics and Photonics 2004," vol. 5464, Sep. 2004, pp. 1-9.

Harris, G. S. et al. "The Reaction of Trispentafluorophenylstibine with Halogens and Interhalogens," J. Fluorine Chem. 37 (1987) pp. 247-252.

Heinze, J. et al., "Polarographic studies of the conformation of 1,2,3,4,5-pentaarylimidazolium cations," The Institute for Physical Chemistry at the University of Freiburg, pp. 1-22, 1972.

Hill, J. "Oxidative Dimerization of Benzimidazole," J. Org. Chem. 1963, 28, pp. 1931-1932.

Hopf et al. "Uber einen neuen Kohlenwasserstoff C18H24 . . . ," Helvetica Chimica Acta, vol. XLIV, Issue II (1961), No. 46, extract from p. 380-386.

Hopf et al., "Preparation and Properties, Reactions, and Applications of Radialenes," Angewandte Chemie, vol. 31, No. 8, Aug. 1992, pp. 931-954.

Iyoda, et al. "Novel synthesis of hexaaryl[3]radialenes via dibromo[3]dendralenes," Tetrahedron Letters 41 (2000), 6 pgs.

Japp, F. et al. "Constitution of Glycosine," J. Chem. Soc. Trans. 1887, 51, pp. 552-557.

Jefferson, Alan M. and Suschitzky, H., "New Route to Nucleophillically Substituted o-phenylenediamines," J.C.S. Chem. Comm. pp. 189-190, 1997.

Jensen, W.B.; The Generalized Lewis Acid Based Concepts, John Wiley & Sons, New York, 1980, pp. 113-195.

Ji, L. et al. "Mono-, di- and tetra-nuclear ruthenium (II) complexes containing 2,2'p-phenylenebis(imidazo[4,5-f]phenanthroline): synthesis, characterization and third-order non-linear optical properties," J. Chem. Soc., Dalton Trans. 2001, pp. 1920-1926.

Katz, H.E. et al., "Pyridyl Dicyanoquinodimethane Acceptors for Electroactive Solids," J. Org. Chem. 56 (1991) pp. 5318-5324.

Kaufhold, Von Jurgen et al., "Uber das Leitfahigkeitsverhalten verschiedener Phthalocyanine im Vakuum und unter dem Einfluss von gasen," Ber. Bunsen. Phys. Chem. 69, pp. 168-179.

Kikuchi, A et al. "A new family of pi-conjugated delocalized biradicals: electronic structures of 1,4-bis(2,5-diphenylimidazol-4-ylidene)cyclohexa-2,5-diene," J. Phys. Chem. B., 2005, 109, pp. 19448-19453.

Kikuchi, A. et al. "Definitive Evidence for the Contribution of Biradical Character in a Closed-Shell Molecule, Derivative of 1,4-Bis-(4,5-diphenylimidazol-2-ylidene)cyclohexa-2,5-diene," J. Am. Chem. Soc. 2004, 126, pp. 6526-6527.

Kimura, M. et al. "Preparation of 4-(4,5-diphenyl-1H-imidazol-2-yl)benzaldehyde and Its Practical Synthetic Use in the Synthesis of Unsymmetrically Substituted Imidazoles," ITE Letters on Batteries, New Technologies and Medicine, 2002, 3, pp. 30-34.

Klopman, G. "Chemical Reactivity and the Concept of Charge-and Frontier-controlled reactions," Journal of the American Chemical Society., vol. 90, No. 2, Jan. 17, 1968, pp. 223-234.

Koster, et al. "Synthesis and reactions of a tetraquinocyclobutane," Dept. of Chemistry, Univ. of Wisconsin, J. Org. Chem., vol. 40, No. 16, 1975, pp. 2300-2304.

Kozaki, M. et al. "Preparation, Properties, and Reduction of Heteroaromatic Quinoids with 1,4-diazacyclopentadien-2-ylidene Terminals," Org. Lett. 2005, 7, pp. 115-118.

Krebs, F.C. et al. "Superradiant properties of 4,4'-bis(1H-phenanthro[9,10-d]imidazol-2-yl)biphenyl and how a laser dye with exceptional stability can be obtained in only one synthetic step," Tetrahedron Lett. 2001, 42, pp. 6753-6757.

Kulkarni, A.P. et al., "Electron transport materials for organic light-emitting diodes," Chem. Mater. 2004, 16, pp. 4556-4573.

Lane, E.S. "A Modified Benziminazole Synthesis," J. Chem. Soc. 1953, pp. 2238-2240.

Lehmstaedt, K. et al. "Halogen-2,2'-diimidazole und ihre Umsetzungen mit Aminen zu Farbstoffen," Ber. Dt. Chem. Ges. B, 1943, pp. 879-891.

Leyden, R. et al. "Thermally Induced Degradation of 2,3,5,6-tetrachloroterephthalylidenebis(o-aminoaniline)," J. Org. Chem. 1983, 48, pp. 727-731.

Li, J. Y. et al. "Enhancement of green electroluminescence from 2,5-di-p-anisyl-isobenzofuran by double-layer doping strategy," Preparation and Characterization, vol. 446, No. 1, pp. 111-116.

Ludvik, J. and Pragst, F. et al., "Electrochemical generation of triplet states," Journal of Electroanalytical Chemistry, No. 180, pp. 141-156, (1984).

Ludvik, J. and Volke, J. "Evidence for a radical intermediate in the anodic oxidation of reduced nicotinamide adenine dinucleotides obtained by electrogenerated chemiluminescence," Analytica Chimica Acta, 209 (1988) 69-78.

Maennig, B. et al., "Organic p-i-n solar cells," App. Phys. 2004, A 79, pp. 1-14.

Matschke, M. et al. "Bis-4h-imidazoles-tetraazafulvalenes-2,2'-biimidazoles: three variations of one redox system," Tetrahedron, vol. 62, No. 36, Sep. 4, 2006, pp. 8586-8590.

Mayer, U. et al. "Uber 2,3,6,7-tetraphenyl-1,4,5,8-tetraazafulvalen," Tetrahedron Lett. 1966, 42, pp. 5221-5223.

Mayer, U. et al. "Uber Biradikale, Chinone und Semichinone der Imidazolyl-Reihe," Angew. Chem. 1966, 78, p. 303.

Minoura, M. et al. "Hexaaryltellurium, the First Neutral Compounds Comprising Hexaarylated Elements," Angew. Chem. Int. Edit. 35 (22) pp. 2660-2662 (1996).

Miyasato, M. et al. "Syntheses and Reactions of Hexavalent Organitellurium Compounds Bearing Five or Six Tellurium-Carbon Bonds," Chem.—A European J. 10(10) pp. 2590-2600 (2004).

Muramatsu, T. et al, "Visible Light Sensitive Cyclomer and Its Tautomeric Dispiro Compound Formed from Bispyridiny Diradical," J. Am. Chem. Soc. 2005, 127, 4572-3.

Muramatsu, T. et al., "Photosensitive Cyclomer Formation of 1,1'-(1,2-ethanediyl)bis(pyridinyl) diradical and its derivativese," J. Am. Chem. Soc. 1989, 111, 5782-7.

Muramatsu, T. et al., "Preparation and Properties of a novel heterocyclic dispiro compound, 3, 10-diaza-N,N-dimethyldispiro[5.0.5.3]pentadeca-1,4,8,11-tetraene," Chemistry Letters, pp. 151-152, (1996).

Nelsen, Stephen, F.; "Heterocyclic Radical Anions. II. Naphthalic and 1,4,5,8-Naphthalenetetracarboxylic Acid Derivatives," Journal of the American Chemical Society, 89:23, Nov. 8, 1967, pp. 5925-5931.

Oeter, D. et al., "Doping and Stability of Ultrapure alpha-oligothiophene Thin Films," Synthetic Metals, 61, 1993, pp. 147-150.

Okada, K. et al. "Detection of a diradical intermediate in the cis-trans isomerization of 5,5'-bis(4,5-diphenyl-2H-imidazol-2-ylidene)-5,5'-dihydro-delta 2,2'-bithiophene," Tetrahedron Lett. 2006, 47, pp. 5375-5378.

Okada, K. et al. "Novel Dimers of 2,2'-(m-Phenylene)bis(4,5-diphenyl-1-imidazolyl) Diradical," Chem. Lett. 1998, pp. 891-892.

Otero, A. et a. "Pentachlorophenyl-arsenic, -antimony and -bismuth compounds," J. of Organometallic Chemistry, vol. 171, No. 3, Jan. 1, 1979, pp. 333-336.

Otero, A. et al. "Pentafluorophenylantimony compounds," J. Organometallic Chem. 154 (1978) pp. 13-19.

Ouchi, A. et al. "13C-nuclear magnetic resonance of some triaryl- and tri-alkylantimony and -bismuth derivatives," J. of Inorganic and Nuclear Chemistry, vol. 37, Issue 11, Nov. 1975, pp. 2347-2349.

Ouchi, A. et al. "The syntheses and properties of some alkylthioacetato and arylthioacetato derivatives of triphenylantimony(V) and -bismus (V)," J. of Inorganic and Nuclear Chemistry, vol. 37, Issue 12, Dec. 1975, pp. 2559-2561.

Park, S. B. et al. "Highly Efficient, Recyclable Pd(II) Catalysts with Bisimidazole Ligands for the Heck Reaction in Ionic Liquids," Organic Lett. 2003, 5, pp. 3209-3212.

Parthasarathy, G. et al., "Lithium doping of semiconducting organic charge transport materials," J. Appl. Phys., vol. 89, No. 9, May 1, 2001, pp. 4986-4992.

Petzhold, C. "Beitrage zur Synthese funktioneller 1,4,5,8-tetraazafulvalene," Dissertation; Friedrich-Schiller-Universitat Jena; 2006.

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Quast, H. and Schmitt, E.; "Note Regarding the Quaternization of Heterocycles," Institute of Organic Chemistry at the University of Wurzburg, Chem. Ber. 101, pp. 4012-4014, (1968).

Rake, A. T. et al. "Pentafluorophenyl and phenyl-phosphinidene ions and their group V analogues," Oms. Organic Mass Spectrometry, vol. 3 Jan. 1, 1970, pp. 237-238.

Rasmussen, P.G. et al. "Complexes of the New Ligand Tetracyanobiimidazole," J. Am. Chem. Soc. 1982, 104, pp. 6155-6156.

Rezende, M. C. et al. "An Alternative Preparation of Bisbenzimidazoles," Syn. Comm. 2001, 31, pp. 607-613.

Rezende, M. et al. "Puzzling Formation of Bisimidazole Derivatives from Hexachloroacetone and Diamines," Tetrahedron Lett. 1996, 37, 5265-5268.

Sakaino, Y. "Structures and Chromotropic Properties of 1,4-bis(4,5-diphenylimidazol-2-yl)benzene Derivatives," J. Org. Chem. 1979, 44, pp. 1241-1244.

Sato, S. et al. "Isolation and Molecular Structure of the Organopersulfuranes [12-S-6(C6)]," J. Am. Chem. Soc. 128(21) pp. 6778-6779 (2006).

Schmidt, "Reaktionen von Quadratsaure und Quadratsaure-Derivaten," Synthesis, Dec. 1980, extract pp. 966, 24 total pages.

Schneiders, P. et al. "Notiz zur Darstellung von 4,4',5,5'-tetrasubstituierten Di-2-imidazolyl-derivaten. Ausgangsprodukte zur Darstellung von 1,4,5,8-tetraazafulvalenen," Chem. Ber. 1973, 106, pp. 2415-2417.

Schwarz, W. M. et al., "Formation of Stable Free Radicals on Electroreduction of N-alkylpyridium salts," J. Am. Chem. Soc., 33 3164 (1961).

Seitz, G., Nachr. Chem. Tech. Lab 28 (1980), No. 11, extract pp. 804-807, total pp. 6: "Pseudooxokohlenstoffe.".

Sekine, T. et al. "Dimerizations of pi-Rich N-heteroaromatic compounds and xanthine derivatives," Chem. Pharm. Bull. 1989, 37, pp. 1987-1989.

Sharma, G.D. et al., "Influence of Iodine on the Electrical and Photoelectrical Properties of Zinc Phthalocyanine Think Film Devices," Materials Science and Engineering, B41, 1996, pp. 222-227.

Singhal, K. et al. "One the Lewis acidity of tris(pentafluorophenyl)antimony (V) dichloride towards neutral monodentate O, N and S donor ligands," Journal of Fluorine Chemistry, vol. 121, No. 2, Jun. 1, 2003, pp. 131-134.

Smith, M.B. Organic Synthesis, McGraw-Hill, Inc. 1994, Chapter 1.

Sprenger, et al. "The cyclobutenediylium cation, a novel chromophore from squaric acid," Angew. Chem. International Edition, vol. 6 (1967), No. 6, pp. 553-554.

Suschitzky, H. "Syntheses and Reactions of 2,2'-bisbenzimidazole Systems," J. Heterocyclic Chem. 1999, 36, pp. 1001-1012.

Suzuki, T. et al., "4,7-bis(dimethylamino)benzimidazoles and twin-type derivatives: reversible two-stage redox system modulated by proton-transfer," Tetrahedron Lett. 2003, 44, pp. 7881-7884.

Takahashi et al. "Novel Electron Acceptors for Organic Condcutors: 1,2-Bis(p-benzoquino)-3-[2-(dicyanomethylene)-2,5-thienoquino]cyclopropane Derivatives," J. Chem. Soc., Chem. Commun., 1994, pp. 519-520.

Takahashi et al. "Novel metallic charge-transfer complexes composed of a [3]radialene type acceptor: a 1,2-bis(p-benzoquino)-3-[2-(dicyanomethylene) . . ." Advanced Materials, July, No. 7, 3 pgs.

Vaid T.P. et al, "Investigations of the 9,10-diphenylacridyl radical as an isostructural dopant for the molecular semiconductor 9, 10-diphenylanthracene," Chemistry of Materials, American Chemical Society, Bd. 15, Nr. 22, 4292-4299 (2003).

Vyas, P.C. et al. "A simple synthesis of 2,2'-bis-benzimidazoles," Chem. Industry, 1980, pp. 287-288.

Weiss, M. "Acetic Acid-Ammonium Acetate Reactions. 2-Isoimidazoles as Intermediates in Imidazole Formation," J. Am. Chem. Soc. 1952, 74, pp. 5193-5195.

West, R. et al., "Diquinocyclopropanones, Diquinoethylenes, and the Anion-Radical and Free-Radical Intermediates in their Formation," Dept. of Chemistry, Univ. of Wisconsin, Feb. 24, 1975, pp. 2295-2299.

Wintgens, V. et al., "Reduction of Pyrylium Salts: Study by ESR and UV_Visible Spectroscopy of the Reversible Dimerization of the Pyranyl Radical," New. J. Chem., 10/6, 345-350 (1986).

Yamaguchi, et al., "New Approaches to Tetracyanoquinodimethane," Bull. Chem. Soc. Jpn. 62 (1989) pp. 3036-3037.

Yamamoto, Y. et al. "The Electrical Properties of the Poly(N-vinyl Carbazole)-Antimony (V) Chloride (or Iodine) Charge Transfer Complexes," Bull. Chem. Soc. Jap. 1965, 38, 2015-2017.

Yoshiko, S., et al. "The Quinoid-biradical Tautomerism of 3,6-bis(4,5-diphenyl-2H-imidazol-2-ylidene)-1,4-cyclohexadiene," Nippon Kagaku Kaishi, 1972, 1, pp. 100-103.

Yukihiko, T., et al. "Studies on Aromatic Nitro Compounds. V. A Simple One-Pot Preparation of o-Aminoaroylnitriles from Some Aromatic Nitro Compounds," Chem. Pharm. Bull., 33 (4) 1360-1366 (1985).

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

Ziegenbein, W. "The cyclobutenediylium cation, a novel chromophore from squaric acid," Angew. Chem., 79:12, pp. 581-582 (1967).

English Translation of Japanese Office Action; Japanese Patent Application No. 2005-228491; Apr. 17, 2009.

International Search Report, International App. No. PCT/EP2007/002359, May 24, 2007.

Final Office Action, U.S. Appl. No. 11/688,777; Nov. 27, 2009.
Non-Final Office Action, U.S. Appl. No. 11/688,777; Feb. 2, 2009.
Response to Office Action, U.S. Appl. No. 11/688,777; Sep. 4, 2009.
Response to Office Action, U.S. Appl. No. 11/688,777; Aug. 3, 2009.
Restriction Requirement, U.S. Appl. No. 11/688,777; Mar. 5, 2010.
Response to Restriction Requirement, U.S. Appl. No. 11/688,777; Apr. 1, 2010.
Notice of Allowance, U.S. Appl. No. 11/196,491; Apr. 13, 2009.
Notice of Allowance, U.S. Appl. No. 11/196,491; Oct. 20, 2008.

Response to Office Action for U.S. Appl. No. 11/196,491; Aug. 11, 2008.
Final Office Action, U.S. Appl. No. 11/196,491; Feb. 11, 2008.
Response to Office Action for U.S. Appl. No. 11/196,491; Nov. 5, 2008.
Non-Final Office Action, U.S. Appl. No. 11/196,491, Jul. 3, 2007.
International Search Report and Preliminary Report on Patentability for PCT/DE2008/001080; Jul. 11, 2008.
International Search Report for PCT/DE2008/00654; Jun. 15, 2009.
International Search Report and Preliminary Report on Patentability for PCT/EP2006/010816; Feb. 9, 2007.
Advisory Action for U.S. Appl. No. 11/315,072 mailed Mar. 8, 2010.
Response to Final Office Action for U.S. Appl. No. 11/315,072; Feb. 17, 2010.
Final Rejection for U.S. Appl. No. 11/315,072; Nov. 16, 2009.
Response to Office Action for U.S. Appl. No. 11/315,072; Jul. 29, 2009.
Non-Final Rejection for U.S. Appl. No. 11/315,072; Apr. 29, 2009.
Non-Final Rejection for U.S. Appl. No. 11/315,072; Nov. 12, 2008.
Response to Office Action for U.S. Appl. No. 11/315,072; Feb. 10, 2009.
European Search Report for EP 07009366; Oct. 19, 2007.
International Search Report for PCT/EP2008/003792; Sep. 2, 2008.
Disclosure Pursuant to 37 C.F.R. 1.56 for U.S. Appl. No. 12/293,757 (submitted herewith).
Bard, A. J., Faulkner, R.J., Electrochemical Methods: Fundamentals and Applications, Wiley, 2nd Ed., 2000 (Chapter 2).
D'Andrade, B.W. et al., "Relationship between the ionization and oxidation potentials of molecular organic semiconductors," Organic Electronics 6, 2005, pp. 11-20.
Gao, W. et al., "Effect of electrical doping on molecular level alignment at organic-organic heterojunctions," Applied Physics Letters, vol. 82, No. 26, Jun. 30, 2003, pp. 4815-4817.
Harada, K. et al. "Organic Homojunction Diodes with a High Built-in Potential: Interpretation of the Current-Voltage Characteristics by a Generalized Einstein Relation," Phys. Rev. Lett. 94, 036601 (2005).
Kido, Junji et al., "Bright Organic Electroluminescent Devices Having a Metal-doped Electron-injecting Layer," Applied Physics Letters, vol. 73, No. 20, Nov. 16, 1998, pp. 2866-2868.
Maitrot, M. et al., "Molecular material based junctions: Formation of a Schottky Contact with Metallophthalocyanine Thin Films Doped by the Cosublimation Method," J. Applied Physics, 60(7), Oct. 1, 1986, pp. 2396-2400.
Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.
R. Schlaf et al., "Homo/Lumo Alignment at PTCDA/ZnPc and PTCDA/ClInPc Heterointerfaces Determined by Combined UPS and XPS Measurements," J. Phys. Chem. B 1999, 103, pp. 2984-2992.
Tang, C.W. et al., "Organic electroluminescent diodes," Applied Physics Letters, vol. 51, No. 12, Sep. 21, 1987, pp. 913-915.
Tang, T.B. et al., "Ionization thresholds of merocyanine dyes in the solid state," Journal of Applied Physics, vol. 59, (1), Jan. 1986, pp. 5-10.
Werner, A. G. et al., "Pyronin B as a donor for n-type doping of organic thin films," Applied Physics Letters, vol. 82, No. 25, Jun. 23, 2003, pp. 4495-4497.
Yao, Fu et al., "Quantum-chemical predictions of Absolute standard redox potentials of diverse organic molecules and free radicals in acetonitrile," J. Am. Chem. Soc. 2005, 127, pp. 7227-7234.
Zhou, X. et al., "Very low operating voltage organic light-emitting diodes using a p-doped amorphous hole injection layer," Applied Physics Letters, vol. 78, No. 4, Jan. 22, 2001, pp. 410-412.
Zimmerman, T. et al. "Benzocycloalkenone und dihydro-2H, 7H-1-benzopyranone aus 2,4,6-triaryl-pyryliumsalzen und cycloalkan-1,2-dionen," J. Prakt. Chem. 331 pp. 306-318 (1989).
Non-Final Rejection for U.S. Appl. No. 12/046,620; Nov. 25, 2009.
Response to Restriction Requirement for U.S. Appl. No. 12/046,620; Aug. 24, 2009.
Restriction Requirement for U.S. Appl. No. 12/046,620; Jul. 22, 2009.

Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.
Nollau, A. et al., "Controlled n-type doping of a molecular organic semiconductor: naphthalenetetracarboxylic dianhydride (NTCDA) doped with bis(ethylenedithio)-tetrathiafulvalene (BEDT-TTF)," J. Appl. Phys., vol. 87, No. 9, May 1, 2006, pp. 4340-4343.
Parker, "On the Problem of Assigning Values to Energy Changes of Electrode Reactions," Journal of the American Chemical Society, 96:17, Aug. 21, 1974, pp. 5656-5661.
Japanese Office Action which issued in Japanese counter part Application No. 2007-075684 (English Translation) (Jul. 27, 2010).
A. R. Siedle and R. B. Johannesen, "Reduction of the 1,3-dithiolium cation with hexacarbonylvanadate" Journal of Organic Chemistry Bd. 4-,NR. 13 1975, Seite 2002, XP00239600, Verbindungen 1 und 2, Seite 2202.
H. Jadamus, Q. Fernando and H. Freiser, "Metal-ion induced rearrangements of bisbenzthiazolines to Schiff-base chelates", Journal of the American Chemical Society, Bd. 86, 1964, Seiten 3056-3059, XP002396001, Verbindung II, Seite 3056, Verbindungen Va-c, Seite 3058.
E. J. Corey, F. A. Carey and R. .A Winter: 1,2,4 "Stereospecific syntheses of olefins from 1, 2-thionocarbonates and 1,2-thrithiocarbonates, Trans-cycloheptene" Journal of the American Chemical Society, Bd. 87, Nr. 4, 1965, Seiten 934-935, XP002396002, Verbindung V, Seite 935.
E. Bayer and E. Breitmaier, "Die reaktion 1, 2, 4 von Benzil mit 2-Aminothiopheno I" Tetrahedron Letters, Bd. 15 1966, Seiten 1689-1693, XP002396003, Verbindung II, Seite 1689.
H. G. Mautner, "Potential deoxyribonucleic acid cross-linking agents. 8-8'-bispurines", Journal of Organic Chemistry Bd. 26, 1961, Seiten 1914-1917, XP002396004 Verbindung I, Seite 1915.
R. C. Elderfield and E. C. Mcclenachan, "Pyrolisis of the products of the reaction of o-aminobenzenethiols with ketones", Journal of the American Chemical Society, Bd. 82, Seiten 1982-1988, XP002396005, Verbindung VII, Seite 1983.
M. G. Miles, J. S. Wager and J. D. Wilson: 1, 2, 7, "Reactions of 4,5-dicyano-1,3-dithiole-2-thione and 1,3-dithiol-2-one with tervalent phosphorus compounds", Journal of Organic Chemistry, Bd. 40, Nr, 18, 1975, Seiten 2577-2582, XP002396006, Verbindung 5, Scheme II, Seite 2579.
Long, M., "41.4: New Capabilities in Vacuum Thermal Evaporation Sources for Small Molecule OLED Manufacturing", SID 06 Digest, pp. 1474-1476, 2006.
European Office Action for EP Application No. 07723467.2 mailed Oct. 4, 2011.
Gritzner et al., 1984, "Recommendations on Reporting electrode Potentials in Nonaqueous Solvents," Pure & Appl. Chem., 56(4):461-466.
Noviandri et al., 1999, "The Decamethylferrocenium/ Decamethylferrocene Redox Couple: A Superior Redox Standard to the Ferrocenium/Ferrocene Redox Couple for Studying Solvent Effects on the Thermodynamics of Electron Transfer," J. Phys. Chem. B, 1999, 103:6713-6722.
Parsons, 1973, "Manual of Symbols and Terminology for Physicochemical Quantities and Units, Appendix III, Electrochemical Nomenclature," International Union of Pure and Applied Chemistry—Division of Physical Chemistry, Butterworths—London, pp. 503-516.
Translation of Japanese Office Action for JP Application No. 2009-500751 mailed Oct. 2, 2012.
Translation of Japanese Office Action for JP Application No. 2009-500772 mailed Oct. 2, 2012.
Yokoi et al., "Photochemical Doping of TCNQ by Photoinduced Electron Transfer and C-C Cleavage of Radical Cation," 1999, Chemistry Letters, pp. 241-242.
Siedle et al., "Reduction of the 1,3-Dithiolium Cation with Hexacarbonylvanadate(1-)," J. Org. Chem., 1975, pp. 2002-2003, vol. 40, No. 13.

* cited by examiner

USE OF HETEROCYCLIC RADICALS FOR DOPING ORGANIC SEMICONDUCTORS

CROSS-REFERENCE TO RELATED APPLICATION

This is a submission pursuant to 35 U.S.C. 154(d)(4) to enter the national stage under 35 U.S.C. 371 for PCT/EP2007/002359 filed Mar. 16, 2007. Priority is claimed under 35 U.S.C. 119(a) and 35 U.S.C. 365(b) to European Patent Application No. 06005834.4 filed Mar. 22, 2006. The subject matters of PCT/EP2007/002359 and European Patent Application No. 06005834.4 are hereby expressly incorporated herein by reference.

The present invention relates to the use of heterocyclic radicals or heterocyclic diradicals, the dimers, oligomers, polymers, dispiro compounds and polycycles thereof for the use as a dopant for doping an organic semiconductive matrix material, as a blocking layer, as a charge injection layer, as an electrode material, as a memory material or as a semiconductor material itself in electronic or optoelectronic devices.

It is known to modify organic semiconductors with respect to their electrical properties, in particular their electrical conductivity, by means of doping, as is also the case with inorganic semiconductors, such as silicon semiconductors. Here, the conductivity, which is initially quite low, is increased by generating charge carriers in the matrix material and a change in the Fermi level of the semiconductor is achieved, depending on the type of dopant used. Doping in this case leads to an increase in the conductivity of charge transport layers which results in ohmic losses being reduced and to an improved transfer of the charge carriers between contacts and organic layer.

In the case of organic matrix materials, inorganic dopants such as alkali metals (e.g. caesium) or Lewis acids (e.g. $FeCl_3$) are due to their high diffusion coefficient for the most part disadvantageous as the function and stability of the electronic devices are impaired. Furthermore, it is known to release dopants in the semiconductive matrix material by means of chemical reactions to provide dopants. However, the oxidation potential of the dopants released in this way is often not sufficient for various applications, such as in particular for organic light-emitting diodes (OLEDs). Moreover, when releasing the dopants, further compounds and/or atoms, for example atomic hydrogen, are likewise generated whereby the properties of the doped layer and of the corresponding electronic device, respectively, are impaired.

Furthermore, compounds used as dopants often do not have a sufficiently low ionisation potential for the respective application.

Therefore, the underlying object of the present invention is to provide improved organic semiconductive matrix materials, blocking layers, charge injection layers, electrode materials, memory materials or semiconductor layers themselves, in particular in electronic or optoelectronic devices, by means of using particular heterocyclic radicals or heterocyclic diradicals, the dimers, oligomers, polymers, dispiro compounds and polycycles thereof. In particular, the radicals, diradicals and derivatives used should have sufficiently low oxidation potentials, have no interfering effects on the matrix material and provide an effective increase in the number of charge carriers in the matrix material and be comparatively easy to handle.

Further objects of the present invention consist in providing organic semiconductive materials and of electronic devices or optoelectronic devices in which the disclosed radicals or diradicals can be used.

The first object is achieved through the use according to claim 1. The further objects are achieved through the articles of the further independent claims while preferred embodiments are given in the dependent claims.

Within the context of the present invention, the term "dimers" is understood to mean compounds which are formed by reacting two monoradicals or diradicals with each other.

The term "oligomers" is understood to mean compounds which are composed of a plurality of diradicals wherein a first radical end of a diradical reacts with a first radical end of another diradical and a second end of the larger diradical thus newly formed in turn reacts with a second further diradical. The ends of such oligomers can be reacted via monoradicals.

The term "polymer" is understood to mean compounds which, compared to oligomers, are composed of a higher number of diradicals.

According to the present invention, a "dispiro compound" is an intramolecular addition product of a diradical, the radical centres of which are spaced from structural elements of such a kind that said structural element connects the formally radical-bearing carbon atoms which also react with each other.

The term "polycycle" is understood to mean an intramolecular addition product of a diradical, the radical centres of which are spaced from structural elements of such a kind that said structural element connects carbon atoms other than the formally radical-bearing carbon atoms which also react with each other (i.e. at least an atom which is at least in alpha position to the latter).

The radicals $R_{1-9}$ and $R_{11}$ can preferably be substituted aryl wherein the substituents are preferably electron-donating radicals, for example dialkylamine, julolidyl, diarylamine, alkylarylamine, diheterocyclylamine, diheteroalkylamine, alkoxy, aryloxy, alkylmercaptyl, arylmercaptyl, alkyl, sililyl, haloalkyl, cycloalkyl, halocycloalkyl, alkenyl, alkynyl, trialkylsililylalkynyl or styryl.

Surprisingly, it has been found that, when applying the use according to the invention of the disclosed heterocyclic compounds, a dopant that is substantially much stronger and/or more stable than donor compounds known hitherto is available wherein the heterocyclic radicals and diradicals, the dimers, oligomers, dispiro compounds or polycycles thereof are employed in neutral form as an n-dopant for an organic semiconductive matrix material. In particular, when applying the use according to the invention, the conductivity of charge transport layers is substantially increased and/or the transfer of the charge carriers between the contacts and the organic layer is substantially improved in applications as an electronic device. Without being bound by this conception, it is assumed that, when applying the use according to the invention of the heterocyclic compounds in a doped layer, the cations associated with the respective heterocyclic radicals and diradicals are formed, in particular by means of the transfer of at least one electron from the respective heterocyclic radical and diradical, the dimer, oligomer, dispiro compound or polycycle thereof to the surrounding matrix material. In this connection, anions of the matrix material are likewise formed which are mobile on the matrix material. In this way, the matrix material gains a conductivity which is increased in comparison to the conductivity of the undoped matrix material. Conductivities of undoped matrix materials are typically $<10^{-8}$ S/cm, particularly often $<10^{-10}$ S/cm. In this connection, it should be ensured that the matrix materials have a sufficiently high purity. Such purities can be achieved with conventional methods, for example gradient sublimation. The conductivity of such matrix materials can be increased to more than $10^{-8}$ S/cm, often $>10^{-6}$ S/cm by means of doping. This applies in particular to matrix materials which show a reduction potential of less than −1V vs. Fc/Fc$^+$, preferably less than −1.7V vs. Fc/Fc$^+$, in particular less than −2.1V vs. Fc/Fc$^+$. The designation Fc/Fc$^+$ relates to the redox pair ferrocene/ferrocenium which is used as a reference in the determination of an electrochemical potential, for example cyclic voltammetry.

According to the invention, it has further been found that the described heterocyclic compounds can also be employed as an injection layer in electronic devices, preferably between an electrode and a semiconductor layer which can also be doped, or also as a blocking layer, preferably between the emitter layer and the transport layer, or as a semiconductor layer in electronic devices. The use according to the invention allows for a photo-induced or light-induced irreversible doping of organic semiconductors by means of the use according to the invention, in particular the generation of the so-called radicals and diradicals by cleaving the dimers or oligomers or dispiro compounds thereof by means of electromagnetic radiation and a subsequent irreversible doping of n-conductive semiconductors. When applying the use according to the invention, the described heterocyclic compounds preferably represent isolated molecules which thus preferably are present in the respective semiconductive layer as isolated molecules which are not attached to each other by chemical bonds and/or to a matrix or to another component. The dopants according to the invention have a surprisingly high stability with regard to their reactivity with the atmosphere.

accordance with the method of Suschitsky et al., J.C.S. Chem. Comm., 1977, 189-90. A preparation of benzthiazoles can be prepared analogously via the o-mercaptoanilines.

Perarylated imidazoles can be prepared in accordance with H. Baumgärtel et al. from benzoins, anilines and benzoic chloride (Ber. Bunsenges. (1972) 76/2, 94-100; Chem. Ber. (1968) 101, 3504).

The alkylations of the N atom(s) in the heterocyclic five-membered rings are achieved with dimethyl sulphate or diethyl sulphate in the presence of bases, H. Quast, E. Schmitt, Chem. Ber. 101, 4012-14 (1968), or with alkylhalides. The corresponding cationic products (heteroarenium compounds) can be isolated as the perchlorate, tetrafluoroborate, halide, tetraphenylborate or hexafluorophosphate.

The above-mentioned radicals can be prepared chemically by means of alkali metals or the alkali metal amalgams or electrochemically from the corresponding heteroaromatic cations by means of reduction, T. Muramatsu et al., Chemistry Letters 1996, 151-2; Pragst et al., J. Electroanal. Chem. 180, 1984, 141-56; V. Wintgens, J. Pouliquen, J. Kossanyi, New. J. Chem. 1986, 10/6, 345-50. However, the radicals typically dimerise or polymerise quickly or form dispiro compounds b and tricycles d, T. Muramatsu, A. Toyota, M. Suzuki, J. Am. Chem. Soc. 2005, 127, 4572-3; T. Muramatsu, Y. Ikegami, K. Hanaya, J. Am. Chem. Soc. 1989, 111, 5782-7. The position of the balance also depends on the length and type of the bridge and therefore the ring tension as well as the energetic state of the temperature in particular.

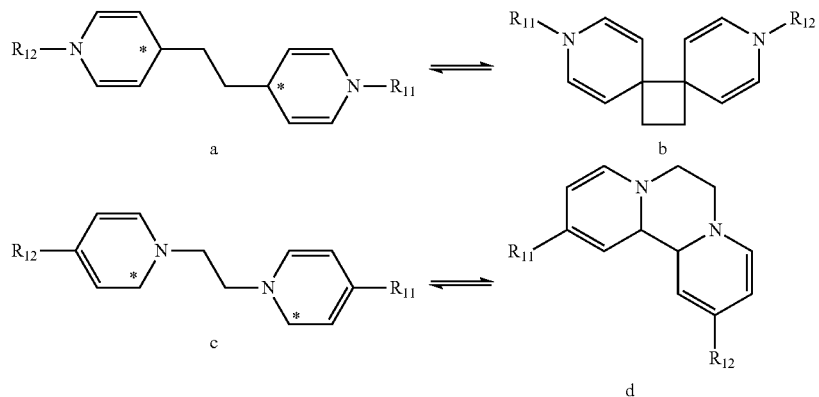

Synthetic Methods

The radicals, diradicals and their derivatives can be synthesised in accordance with known methods; to some extent, they are also commercially available. The synthesis of such compounds is described in the following literature references, for example, which are each incorporated in this application by reference in their entirety. It will be understood that the cited literature references are only given by way of example.

Benzimidazoles can inter alia be easily synthesised from o-phenylenediamine and corresponding carboxylic acid derivatives, M. R. DeLuca, S. M. Kerwin, Tetrahedron 53, 457-64 (1997), or aldehydes (M. Curini et al., Synlett 10, 1832-4, 2004). See also: M. R. Grimmett, "Imidazole and Benzimidazole Synthesis", Academic Press; Harcourt Brace & Company, Publishers, London, San Diego, New York, Boston. o-Phenylenediamines can be purchased or be prepared in Bis-[3-methyl-2-alkyl-1,2-dihydro-benzthiazolyl-(2)] and bis-[3-methyl-2-aryl-1,2-dihydro-benzthiazolyl-(2)] compounds can be prepared directly via benzthiazolium salts and corresponding Grignard compounds, A. Kinya; S. Hiroaki; 1. Naoki; Bull. Chem. Soc. Japan (1979) 52/1, 156-9.

Some particularly stable radicals, e.g. pyridyl radicals, can also be isolated, W. M. Schwarz, E. M. Kosower, I. Shain, J. Am. Chem. Soc. 33, 3164 (1961).

Doping

Quinolinato complexes, for example of aluminium or other metals of the main group, inter alia, can be employed as n-dopable matrix materials wherein the quinolinato ligand can also be substituted. The matrix material can in particular be tris-(8-hydroxy-quinolinato)-aluminium. Other aluminium complexes with O and/or N donor atoms can optionally also be employed.

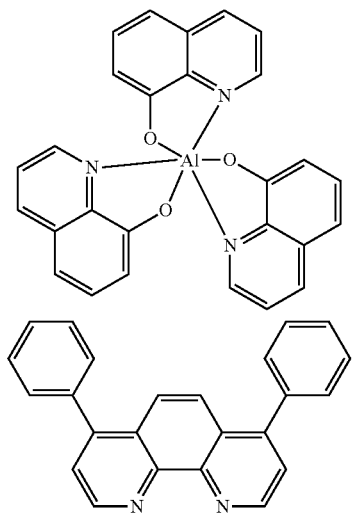

Tris-(8-hydroxy-quinolinato)
BPhen=Bathophenanthroline-aluminium
4,7-diphenyl-1,10-phenanthroline) $C_{24}H_{16}N_2$

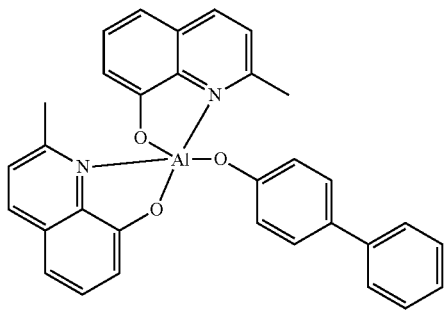

Bis-(2-methyl-8-quinolinolato)-4-(phenyl-phenolato)-aluminium(III)

The quinolinato complexes can for example contain one, two or three quinolinato ligands wherein the other ligands preferably complexes with 0 and/or N donor atoms to the central atom, such as for example above-mentioned Al complex.

Phenanthrolines which can be substituted or unsubstituted, in particular aryl-substituted, for example phenyl-substituted or naphthyl-substituted, can also be employed as the matrix material. In particular, BPhen can be used as the matrix material.

Heteroaromatic compounds such as in particular triazoles can also be employed as the matrix material, optionally also pyrroles, imidazoles, triazoles, pyridines, pyrimidines, pyridazines and the like. The heteroaromatic compounds are preferably substituted, in particular aryl-substituted, for example phenyl-substituted or naphthyl-substituted. In particular, the below-mentioned triazole can be used as the matrix material.

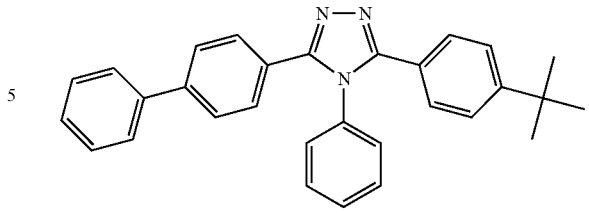

3-(4-Biphenylyl)-4-phenyl-5-tert-butylphenyl-1,2,4-triazole $C_{30}H_{27}N_3$

Preferably, the matrix material used consists completely of a metallophthalocyanine complex, in particular ZnPc, a porphyrin complex, or a Buckminster Fullerene, in particular Fullerene C60.

It will be understood that the mentioned matrix materials can also be employed with each other or with other materials, mixed within the context of the invention. It will be understood that it is also possible to use other suitable organic matrix materials which possess semiconductive properties.

Doping Concentration

The dopant preferably is present in a doping concentration of $\leq 1:1$ to the matrix molecule or the monomeric unit of a polymeric matrix molecule, preferably in a doping concentration of 1:2 or lower, particularly preferably of 1:5 or lower or 1:10 or lower. The doping concentration can be within the range of from 1:1 to 1:100,000, in particular within the range of from 1:5 to 1:10,000 or 1:10 to 1:1,000, for example within the range of from 1:10 to 1:100 or 1:25 to 1:50, without being restricted thereto.

Execution of the Doping

The doping of the respective matrix material with the compounds to be used according to the invention can be performed via one or a combination of the following methods:

a) Mixed evaporation under vacuum with a source of the matrix material and one of the dopant.

b) Sequential deposition of the matrix material and of the n-dopant on a substrate with subsequent diffusion of the dopant into the substrate, in particular by thermal treatment.

c) Doping of a matrix layer through a solution of n-dopants with subsequent evaporation of the solvent, in particular by thermal treatment.

d) Surface doping of a matrix material layer through a superficially applied layer of dopants.

e) Preparation of a solution of matrix molecules and dopants and subsequent preparation of a layer from this solution by means of conventional methods, such as for example evaporation of the solvent or spin coating.

The doping can optionally also be performed such that the dopant is evaporated out of a precursor compound which releases the dopant when it is heated and/or irradiated. As the precursor compound, for example, a carbonyl compound, a dinitrogen compound or the like can in each case be employed which expels CO, nitrogen or the like during the releasing of the dopant, wherein other suitable precursors can also be employed, such as for example salts, e.g. halides, or the like. The selection of such precursor compounds can be aimed at the dopant not being present in this compound as a radical. This can improve the handleability of the dopant. The irradiation can take place by means of electromagnetic radiation, in particular visible light, UV light or IR light, for example in each case laser light, or also by means of other kinds of radiation. By means of the irradiation, the heat required for the evaporation can substantially be provided; it is also possible to irradiate in a targeted manner into particular bands of the compounds or precursor or compound complexes, such as charge transfer complexes, to be evaporated, for example to facilitate the evaporation of the compounds via dissociation of the complexes by means of conversion into excited states. However, the complex can also particularly be sufficiently stable to evaporate under the stated conditions without dissociation or to be applied to the substrate. It will be understood that other suitable methods for carrying out the doping can also be employed.

In this manner, n-doped layers which can be used in many ways can thus be prepared from organic semiconductors.

Semiconductive Layer

By means of the electron-rich radicals, diradicals and the derivatives thereof used according to the invention, semiconductive layers can be produced which optionally are formed rather linear, such as e.g. as conductive paths, contacts or the like. In this connection, the compounds can be employed as n-dopants together with another compound which can act as the matrix material, wherein the doping ratio can be 1:1 or lower. However, the dopant used may also be present in higher proportions in comparison to the respective other compound or component, such that the ratio of dopant to compound can be in a ratio of >1:1, for example in a ratio of $\geq 2:1$, $\geq 5:1$, $\geq 10:1$ or $\geq 20:1$ or higher. The respective other component can be of such a kind as can be employed as the matrix material in the case of the production of doped layers, without being restricted thereto. The dopant used may optionally also substantially be present in pure form, for example as a pure layer.

The region containing one dopant or substantially or completely consisting of the latter can in particular be contacted electrically conductive with an organic semiconductive material and/or an inorganic semiconductive material, for example be arranged on such a substrate.

The mentioned radicals, diradicals and derivatives are preferably employed according to the invention as n-dopants, e.g. in a ratio of $\leq 1:1$ or $\leq 1:2$. By means of the electron-rich compounds used as n-dopants according to the invention, it is possible, for example, to achieve semiconductive layers with conductivities at room temperature in a range of $10^{-5}$ S/cm or higher, for example $10^{-3}$ S/cm or higher, for example $10^{-1}$ S/cm, when using Fullerene C60 as the matrix. When using phthalocyanine-zinc as the matrix, a conductivity of more than $10^{-8}$ S/cm was achieved, for example $10^{-6}$ S/cm. Hitherto, it has not been possible to dope this matrix with organic donors as the reduction potential of the matrix is to low. On the other hand, the conductivity of undoped phthalocyanine-zinc is at most $10^{-10}$ S/cm.

It will be understood that each of the layer and the structure can contain one or more different electron-rich radicals, diradicals and derivatives of such a kind.

Electronic Device

By using the described compounds for the preparation of n-doped organic semiconductive materials which in particular can be arranged in the form of layers or electrically conductive paths, a plurality of electronic devices or devices comprising these with an n-doped organic semiconductor layer can be produced. Within the spirit of the invention, the term "electronic devices" also comprises optoelectronic devices. The electronic properties of an region of the device which is effective in terms of its electronic functions, such as its electric conductivity, light-emitting properties or the like, can be modified in an advantageous way by means of the described compounds. Thus, the conductivity of the doped layers can be improved and/or the improvement of the charge carrier injection of contacts into the doped layer can be achieved.

In particular, the invention comprises organic light-emitting diodes (OLEDs), organic solar cells, field-effect transistors, organic diodes, in particular those with a high rectification ratio, such as $10^3$-$10^7$, preferably $10^4$-$10^7$ or $10^5$-$10^7$, and organic field-effect transistors which have been produced by means of the electron-rich radicals and the derivatives thereof.

An n-doped layer based on an organic matrix material can be present, for example, in the subsequent layer structures within the electronic device, wherein the base materials or matrix materials of the individual layers are preferably organic:

M-i-n: metal-insulator-n-doped semiconductor, wherein the layer M forms the metal base contact and may be, for example, ITO, Au, Ag, Al etc. The top contact together with the n-doped layer forms an ohmic contact and can consist of Al, for example. The layer "I" represents an undoped layer.

n-i-M: the explanations with regard to the M-i-n structure apply; however, in contrast to that, the ohmic contact is provided on the substrate.

p-i-n: p-Doped semiconductor-insulator-n-doped semiconductor, n-i-p: n-Doped semiconductor-insulator-p-doped semiconductor.

Again, "i" is an undoped layer, "p" is a p-doped layer. Here, the contact materials are hole-injecting wherein a layer or a contact made of ITO or Au, for example, can be provided on the p-side, or electron-injecting wherein a layer or a contact made of ITO, Al or Ag can be provided on the n-side.

It is also possible to dispense with the i layer in above structures, if necessary, whereby layer sequences with p-n or n-p transitions can be obtained.

However, the use of the described compounds is not restricted to the above-mentioned exemplary embodiments; in particular, the layer structures may be supplemented or modified by introducing additional suitable layers. In particular, OLEDs with such layer sequences, in particular with a pin structure or a structure inverted to the latter, can in each case be constructed with the described compounds.

It is possible in particular to produce organic diodes of the metal-insulator-n-doped semiconductor (min) type or also optionally of the pin type by means of the described n-dopants, for example based on phthalocyanine-zinc. These diodes show a rectification ratio of $10^5$ or higher. Furthermore, electronic devices with p-n transitions can be produced by using the dopants according to the invention, wherein the same semiconductor material is in each case used for the p-doped and n-doped side (homo-p-n transition) and wherein a described electron-rich radical or the derivative thereof is employed for the n-doped semiconductor material.

According to the invention, the electron-rich radicals and derivatives can be employed in the electronic devices, but also in layers, conductive paths, point contacts or the like, if these are outweighing another component, for example as an injection layer in a pure or substantially pure form.

Other objects and advantages of the present invention are now depicted by means of the following examples which are only for illustrative purposes and are not intended to limit the scope of the invention.

APPLICATION EXAMPLES

A radical that is extremely rich in electrons or the oligomer thereof, preferably dimer, as well as diradicals or the dispiro compounds and tricycles are provided.

The presented radical, dimer, oligomer or the dispiro compound as well as the tricycle is concurrently evaporated with the matrix material. According to the exemplary embodiment, the matrix material is phthalocyanine-zinc or Fullerene C60, respectively. The n-dopant and the matrix material can be evaporated such that the layer deposited on a substrate in a vacuum evaporation apparatus has a doping ratio of n-dopant to matrix material of 1:10.

The in each case with the n-dopant doped layer of the organic semiconductor material is applied to an ITO layer (indium tin oxide) which is arranged on a glass substrate. After application of the n-doped organic semiconductor layer, a metal cathode is applied, for example by sputtering of a suitable metal, to produce an organic light-emitting diode. It will be understood that the organic light-emitting diode may also have a so-called inverted layer construction which has the following layer sequence: glass substrate-metal cathode-n-doped organic layer-transparent conductive top layer (for example ITO). It will be understood that, depending on the application, further layers can be provided between the individual layers mentioned. At the end of the evaporation process, some devices were irradiated with UV radiation after which an irreversible increase in the conductivity could be noted. In this connection, halogen lamps or mercury vapour lamps can be employed, for example.

Example 1

The neutral dimer 1,1',2,2',4,4',6,6'-octamethyl-4,4'-bis[1,4-dihydropyridinyl-(4)] was used for the doping of ZnPc as the matrix material. Doped layers with a doping ratio of dopant to matrix material of 1:10 were produced by means of mixed evaporation of matrix and dopant with ZnPc. The reduction potential of ZnPc is ca. $-1.3V$ vs. $Fc/Fc^+$.

The conductivity was $9 \times 10^{-5}$ S/cm.

Example 2

The Fullerene C60 was doped with the 1,3-di-(4-anisyl)-2,4,5-triphenylimidazolyl radical in a ratio of 10:1. The conductivity was around $2 \times 10^{-5}$ S/cm. The reduction potential of C60 is ca. $-1.0V$ vs. $Fc/Fc^+$.

Example 3

The neutral dimer 2,2',4,4',6,6'-hexamethyl-4,4'-bi-4H-pyran was prepared by conventional methods.

The dimer was then filled into an evaporator source, with C60 as the matrix material. Doped layers with a doping ratio of dopant to matrix material of 1:10 were produced by means of mixed evaporation of matrix and dopant with C60.

The conductivity was around $3 \times 10^{-5}$ S/cm.

Example 4

The neutral dimer bis-[1,2,3-trimethyl-1,2-dihydro-benzimidazolyl-(2)] was prepared by conventional methods.

The dimer was then filled into an evaporator source, with ZnPc as the matrix material. Doped layers with a doping ratio of dopant to matrix material of 1:10 were produced by means of mixed evaporation of matrix and dopant with ZnPc.

The conductivity was around $6 \times 10^{-4}$ S/cm.

Example 5

The neutral dimer bis-[1,2,3-trimethyl-1,2-dihydro-benzimidazolyl-(2)] was prepared by conventional methods.

The dimer was then filled into an evaporator source, with C60 as the matrix material. Doped layers with a doping ratio of dopant to matrix material of 1:10 were produced by means of mixed evaporation of matrix and dopant with C60.

The conductivity was around $2 \times 10^{-3}$ S/cm.

Example 6

The neutral dimer bis-[1,2-dimethyl-1,2-dihydro-benzthiazolyl-(2)] was prepared by conventional methods. The dimer was then filled into an evaporator source, with C60 as the matrix material. Doped layers with a doping ratio of dopant to matrix material of 1:10 were produced by means of mixed evaporation of matrix and dopant with C60.

The conductivity was around $3 \times 10^{-4}$ S/cm.

The features of the invention disclosed in the preceding description and the claims can be essential for the implementation of the invention in its different embodiments both on their own and in any combination.

The invention claimed is:

1. An organic semiconductive material comprising at least one organic matrix compound and a dopant comprising a heterocyclic radical, a heterocyclic diradical, or the dimers, oligomers, polymers, dispiro compounds, or polycycles thereof, the heterocyclic radical or diradical having a structure in accordance with the following formula:

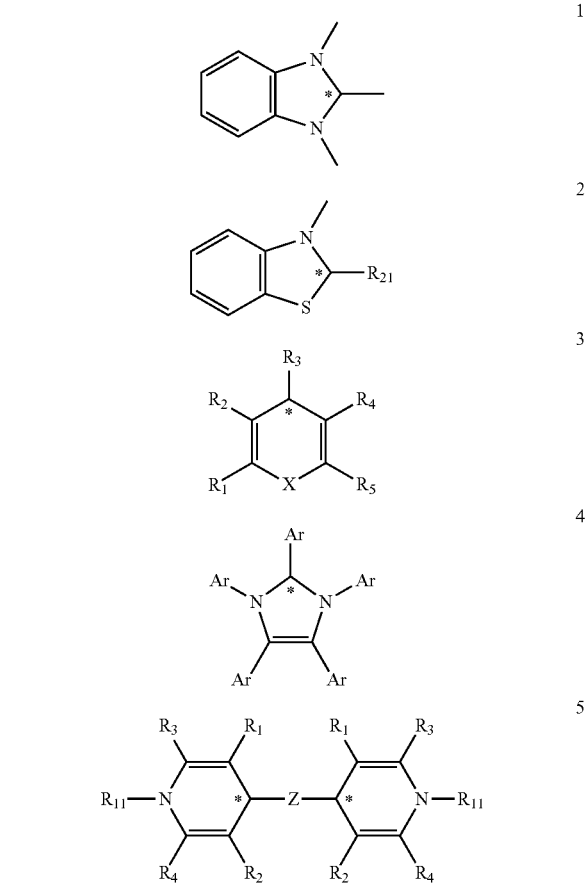

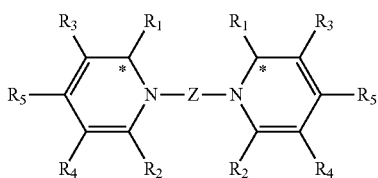

wherein X is O, S, or NR$_{11}$; Z is alkyl; Ar is, independently of another, phenyl, anisyl, or tosyl; R$_1$-R$_5$ and R$_{11}$ are independently selected from the group consisting of, substituted or unsubstituted, aryl, heteroaryl, heterocyclyl, diarylamine, diheteroarylamine, dialkylamine, heteroarylalkylamine, arylalkylamine, H, cycloalkyl, halocycloalkyl, a spiro compound, heterocycloalkyl, alkyl, alkenyl, alkynyl, trialkylsilyl, triarylsilyl, halogen, styryl, alkoxy, aryloxy, thioalkoxy, thioaryloxy, silyl, trialkylsilylalkynyl and a (hetero)aliphatic or (hetero) aromatic ring system comprising, individually or in combination, R$_1$-R$_5$ and R$_{11}$; and R$_{21}$ is methyl, ethyl, butyl, phenyl, 4-tosyl, 4-anisyl, or 4-chlorophenyl.

2. The organic semiconductive material according to claim 1, wherein the molar doping ratio of dopant to matrix molecule or the doping ratio of dopant to monomeric units of a polymeric matrix molecule is between 20:1 and 1:100000.

3. The organic semiconductive material according to claim 2, wherein the molar doping ratio of dopant to matrix molecule or the doping ratio of dopant to monomeric units of a polymeric matrix molecule is between 10:1 and 1:1,000.

4. The organic semiconductive material according to claim 2, wherein the molar doping ratio of dopant to matrix molecule or the doping ratio of dopant to monomeric units of a polymeric matrix molecule is between 1:1 and 1:100.

5. The organic semiconductive material according to claim 1, wherein Z is C$_1$-C$_{10}$ alkyl.

6. An organic semiconductive material comprising at least one organic matrix compound and a dopant comprising a heterocyclic radical, a heterocyclic diradical, or the dimers, oligomers, polymers, dispiro compounds or polycycles thereof, the heterocyclic radical or diradical having a structure in accordance with the following formula:

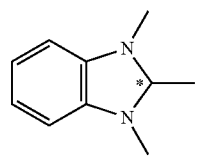

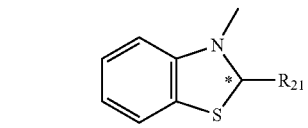

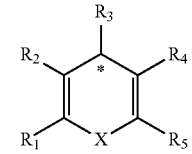

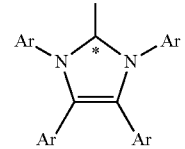

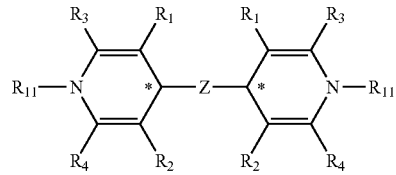

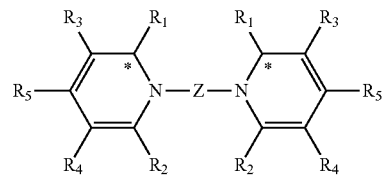

wherein X is O, S, or NR$_{11}$; Z is alkyl; Ar is, independently of another, phenyl, anisyl, or tosyl; R$_1$-R$_5$ and R$_{11}$ are independently selected from the group consisting of, substituted or unsubstituted, aryl, heteroaryl, heterocyclyl, diarylamine, diheteroarylamine, dialkylamine, heteroarylalkylamine, arylalkylamine, H, cycloalkyl, halocycloalkyl, a spiro compound, heterocycloalkyl, alkyl, alkenyl, alkynyl, trialkylsilyl, triarylsilyl, halogen, styryl, alkoxy, aryloxy, thioalkoxy, thioaryloxy, silyl, trialkylsilylalkynyl and a (hetero)aliphatic or (hetero) aromatic ring system comprising, individually or in combination, R$_1$-R$_5$ and R$_{11}$; and R$_{21}$ is methyl, ethyl, butyl, phenyl, 4-tosyl, 4-anisyl, or 4-chlorophenyl,
wherein the molar doping ratio of dopant to matrix molecule or the doping ratio of dopant to monomeric units of a polymeric matrix molecule is between 20:1 and 1:100,000.

* * * * *